(12) United States Patent
Tu

(10) Patent No.: US 7,019,348 B2
(45) Date of Patent: Mar. 28, 2006

(54) EMBEDDED SEMICONDUCTOR PRODUCT WITH DUAL DEPTH ISOLATION REGIONS

(75) Inventor: Kuo-Chi Tu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 33 days.

(21) Appl. No.: 10/789,527

(22) Filed: Feb. 26, 2004

(65) Prior Publication Data
US 2005/0189609 A1 Sep. 1, 2005

(51) Int. Cl.
*H01L 27/108* (2006.01)
*H01L 21/8242* (2006.01)
(52) U.S. Cl. .................. 257/301; 257/510; 438/248; 438/427
(58) Field of Classification Search .......... 257/301, 257/510; 438/427, 243, 246, 248
See application file for complete search history.

(56) References Cited

U.S. PATENT DOCUMENTS

| | | | |
|---|---|---|---|
| 5,360,753 A | 11/1994 | Park et al. | |
| 5,696,021 A | 12/1997 | Chan et al. | |
| 5,930,107 A | 7/1999 | Rajeevakumar | |
| 6,090,661 A * | 7/2000 | Perng et al. | 438/248 |
| 6,232,202 B1 | 5/2001 | Hong | |
| 6,256,248 B1 | 7/2001 | Leung | |
| 6,420,226 B1 | 7/2002 | Chen et al. | |
| 6,468,855 B1 | 10/2002 | Leung et al. | |
| 6,509,595 B1 | 1/2003 | Leung et al. | |
| 6,573,548 B1 | 6/2003 | Leung et al. | |
| 6,833,602 B1 * | 12/2004 | Mehta | 257/501 |
| 6,864,151 B1 * | 3/2005 | Yan et al. | 438/424 |

OTHER PUBLICATIONS

"A 130 nm Generation High Density Etox™ Flash Memory Technology", Kenney, IEEE, IEDM 2001, pp. 41-44, Dec. 2001.

* cited by examiner

*Primary Examiner*—Mark V. Prenty
(74) *Attorney, Agent, or Firm*—Tung & Assoc.

(57) ABSTRACT

An embedded semiconductor product employs a first isolation trench and first isolation region formed therein adjoining a logic cell active region of a semiconductor substrate. The embedded semiconductor product also employs a second isolation trench and second isolation region formed therein adjoining a memory cell active region of the semiconductor substrate. The second isolation trench is deeper than the first isolation trench such that a storage capacitor whose capacitor plate is embedded at least in part within the second isolation region may be formed with enhanced capacitance.

17 Claims, 2 Drawing Sheets

EMBEDDED SEMICONDUCTOR PRODUCT WITH DUAL DEPTH ISOLATION REGIONS

FIELD OF THE INVENTION

The invention relates generally to logic and memory embedded semiconductor products. More particularly, the invention relates to capacitor embedded isolation structures within logic and memory embedded semiconductor products.

DESCRIPTION OF THE RELATED ART

Common in the semiconductor product art is the design and fabrication of embedded semiconductor products. Embedded semiconductor products include separate groups of transistors that perform either logic functions or memory functions. Embedded semiconductor products are desirable insofar as they allow for fabrication of system on a chip (SoC) components while employing a single semiconductor die.

Embedded semiconductor products are not, however, without problems. As semiconductor device dimensions decrease, it becomes increasingly difficult to form memory portions of embedded semiconductor products with adequate capacitance. Inadequate capacitance provides for inadequate data storage capabilities.

The invention is thus directed towards forming embedded semiconductor products with enhanced memory portion capacitance.

SUMMARY OF THE INVENTION

The invention provides an embedded semiconductor product and a method for fabrication thereof. The embedded semiconductor product has an enhanced storage capacitance within a memory portion thereof. The invention realizes the foregoing object by forming a storage trench deeper within a memory cell region of an embedded semiconductor product than in a logic cell region of the embedded semiconductor product. By employing the storage trench deeper within the memory cell region, a storage capacitor of enhanced size may be formed embedded within an isolation region within the isolation trench. Thus, the storage capacitor may also be formed with enhanced capacitance.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides an embedded semiconductor product and a method for fabrication thereof. The embedded semiconductor product has an enhanced storage capacitance within a memory portion thereof. The invention realizes the foregoing object by forming a storage trench deeper within a memory cell region of an embedded semiconductor product than in a logic cell region of the embedded semiconductor product. By employing the storage trench deeper within the memory cell region, a storage capacitor of enhanced size may be formed embedded within an isolation region within the isolation trench. Thus, the storage capacitor may also be formed with enhanced capacitance.

Figure 1:
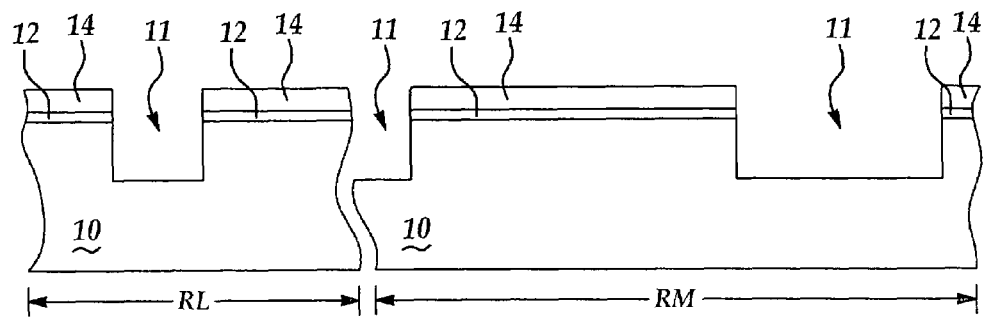
FIG. 1, FIG. 2, FIG. 3, FIG. 4, FIG. 5, FIG. 6 and FIG. 7 show a series of schematic cross-sectional diagrams illustrating the results of progressive stages in fabricating an embedded semiconductor product in accord with the invention.

FIG. 1 to FIG. 7 show a series of schematic cross-sectional diagrams illustrating the results of progressive stages in fabricating an embedded semiconductor product in accord with the invention. FIG. 1 shows a schematic cross-sectional diagram of the semiconductor product at an early stage in its fabrication.

FIG. 1 shows a semiconductor substrate 10. A series of patterned pad dielectric layers 12 is formed upon the semiconductor substrate 10 and a series of patterned silicon nitride layers 14 is formed aligned upon the series of patterned pad dielectric layers 12. The series of patterned pad dielectric layers 12 and the series of patterned silicon nitride layers 14 define the locations of a series of isolation trenches 11 within the semiconductor substrate 10.

The semiconductor substrate may be of any composition, several dopant concentrations and several crystallographic orientations. Exemplary compositions include, but are not limited to silicon semiconductor substrates, germanium semiconductor substrates, silicon-germanium alloy semiconductor substrates, composites thereof and any of the foregoing as "on insulator" semiconductor substrates such as silicon on insulator semiconductor substrates. Typically, the semiconductor substrate 10 is a silicon semiconductor substrate.

The series of patterned pad dielectric layers 12 is typically formed of a silicon oxide dielectric material formed incident to thermal oxidation of the semiconductor substrate 10 when formed of silicon. Other pad dielectric materials may be employed. Typically, each of the series of pad dielectric layers 12 is formed to a thickness of from about 10 to about 50 angstroms.

The series of patterned silicon nitride layers is typically formed employing a chemical vapor deposition (CVD) method. Typically, each of the series of patterned silicon nitride layers 14 is formed to a thickness of from about 200 to about 1000 angstroms.

The series of isolation trenches 11 is typically formed within the semiconductor substrate 10 to a depth of from about 2500 to about 5000 angstroms and a linewidth of from about 0.1 to about 1.0 microns.

As is illustrated in FIG. 1, the semiconductor substrate 10 is divided into two regions. A first region is a logic region RL and a second region is a memory region RM.

Figure 2:
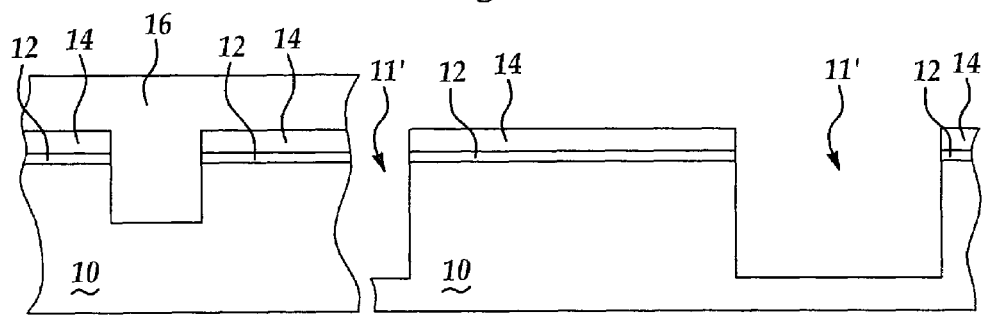

FIG. 2 first shows the results of masking the isolation trench 11 within the logic region RL with a first patterned photoresist layer 16. The first patterned photoresist layer 16 may be formed of either a positive photoresist material or a negative photoresist material. Typically, the first patterned photoresist layer 16 is formed to a thickness of from about 10000 to about 15000 angstroms.

FIG. 2 also shows the results of further etching the pair of isolation trenches 11 within the memory region RM to form a pair of elongated isolation trenches 11' within the memory region RM. The pair of elongated isolation trenches 11' is etched to a depth of from about 4000 to about 9000 angstroms to thus provide an increased depth of from about 1500 to about 4000 angstroms in comparison with the pair of isolation trenches 11.

Figure 3:
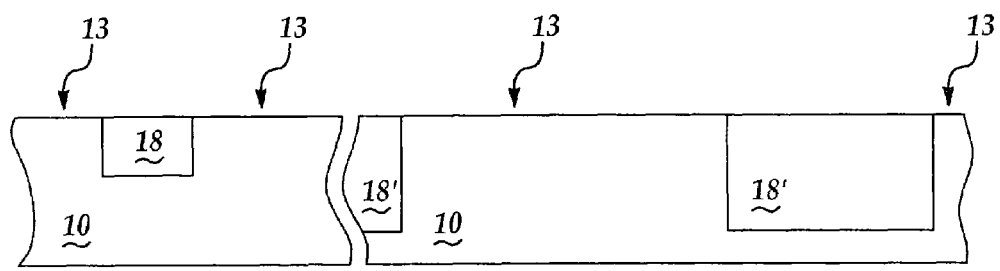

FIG. 3 first shows the results of stripping the first patterned photoresist layer 16, the series of patterned silicon nitride layers 14 and the series of patterned pad dielectric layers 12 from the semiconductor substrate 10. The foregoing layers may be stripped employing methods and materials as are conventional in the semiconductor product fabrication art. Typically, the first patterned photoresist layer will be stripped employing an appropriate photoresist stripping material (either dry plasma, wet chemical or mixture thereof). The series of patterned silicon nitride layers is typically stripped employing a phosphoric acid stripping solution. The series of patterned pad dielectric layers is typically stripped employing an aqueous hydrofluoric acid containing etchant.

FIG. 3 also shows the results of forming: (1) an isolation region 18 within the isolation trench 11 within the logic region RL of the semiconductor substrate 10; and (2) a pair of elongated isolation regions 18' within the pair of elongated isolation trenches 11' within the memory region RM of the semiconductor substrate 10.

The isolation region 18 and the pair of elongated isolation regions 18' are typically formed employing a blanket isolation layer deposition and chemical mechanical polish (CMP) planarizing method. The method will typically employ the series of patterned silicon nitride layers as planarizing stop layers. Thus, the series of patterned silicon nitride layers 14 and the series of patterned pad dielectric layers 12 are often not stripped until after forming the isolation region 18 and the pair of elongated isolation regions 18'.

Figure 4:
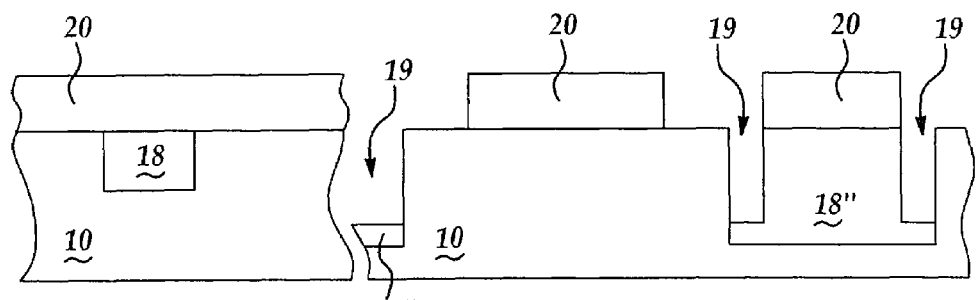

FIG. 4 first shows a series of second patterned photoresist layers 20 formed: (1) fully covering the semiconductor substrate 10 and the isolation region 18 within the logic region RL of the semiconductor substrate 10; and (2) partially covering the active region and the elongated isolation region within the memory region RM of the semiconductor substrate 10. The series of second patterned photoresist layers 20 is formed of photoresist materials and thicknesses analogous, equivalent or identical to the materials and thicknesses employed for forming the first patterned photoresist layer 16.

FIG. 4 also shows the results of etching exposed portions of the pair of elongated isolation regions 18' to form a pair of etched elongated isolation regions 18". The pair of etched elongated isolation regions 18" leaves exposed sidewall portions of the elongated isolation trenches.

Figure 5:
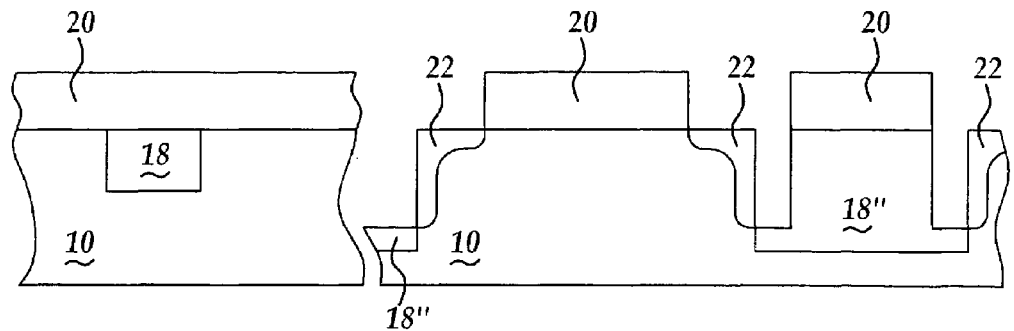

FIG. 5 shows the results of ion implanting exposed corner region portions of the active region of the semiconductor substrate 10 within the memory region RM to form a series of corner implanted regions 22. The ion implanting is undertaken employing a dopant polarity as is appropriate for the semiconductor substrate 10. Typically, the corner implanted regions are have a dopant concentration of from about 1E18 to about 1E20 dopant atoms per cubic centimeter. They also serve as capacitor node layers within a series of storage capacitors formed incident to further precessing of the semiconductor product of FIG. 5.

Figure 6:
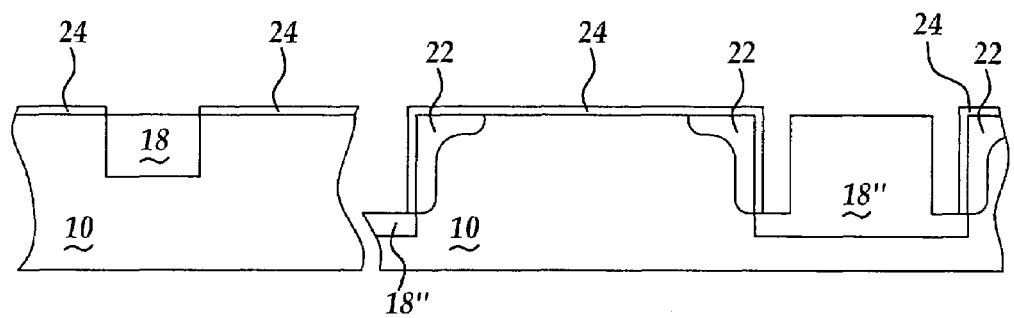

FIG. 6 first shows the results of stripping the series of second patterned photoresist layers 20 from the semiconductor product of FIG. 5. The series of second patterned photoresist layers 20 may be stripped employing methods and materials as are employed for stripping the first patterned photoresist layer 16 as illustrated in FIG. 3.

FIG. 6 also shows a series of gate and capacitor dielectric layers 24 formed upon exposed active regions within the logic region RL and memory region RM of the semiconductor substrate 10, as well as upon exposed sidewalls of elongated isolation trenches within the memory region RM of the semiconductor substrate 10.

The series of gate and capacitor dielectric layers 24 may be formed incident to a thermal oxidation method such as to form the same as oxide layers, i.e., typically silicon oxide layers. Alternatively, the series of gate and capacitor dielectric layers 24 may be formed as deposited dielectric layers while employing methods such as chemical vapor deposition (CVD) methods. The deposited dielectric layers may have generally higher dielectric constants, for example greater than about 10. Higher dielectric constant dielectric materials may include, but are not limited to transition metal oxides, lead zirconate titanate and barium strontium titanate dielectric materials. Typically, the series of gate and capacitor dielectric layers 24 is formed to a thickness of from about 10 to about 200 angstroms.

Figure 7:
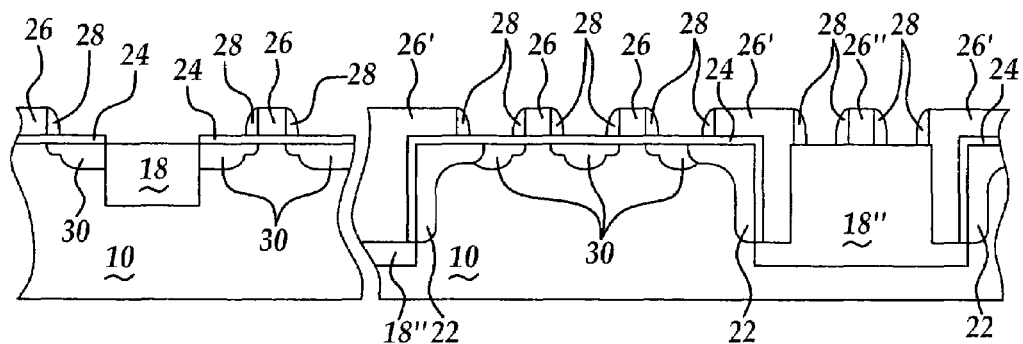

FIG. 7 first shows the results of forming a series of gate electrodes 24 upon the series of gate and capacitor dielectric layers 24 within the logic region RL and memory region RM of the semiconductor substrate. FIG. 7 also shows a series of capacitor plate layers 26' formed upon the series of gate acid capacitor dielectric layers 24 within the memory cell region RM and mirroring the series of corner implanted regions 22 such as to form a series of storage capacitors. FIG. 7 finally shows an interconnect layer 26" formed upon the etched elongated isolation region 18" within the memory region RM of the semiconductor substrate 10.

The series of gate electrodes 26, the series of capacitor plate layers 26' and the interconnect 26" are typically formed incident to patterning of a single deposited layer. The single deposited layer may be a polysilicon or polycide laminate layer. The single deposited layer may also be laminated of several metals and metal nitrides. Typically, the single layer is formed to a thickness of from about 1500 to about 3500 angstroms.

FIG. 7 also shows a series of spacer layers 28 formed adjoining a series of sidewalls of the series of gate electrodes 26, the series of capacitor plate layers 26' and the interconnect 26". The spacer layers 28 may be formed employing a deposition and anisotropic etch method as is otherwise conventional in the semiconductor product fabrication art. Typically, each of the spacer layers 28 is formed of a dielectric material.

FIG. 7 finally shows a series of source/drain regions 30 formed into the active regions of the semiconductor substrate 10 within both the logic region RL and the memory region RM. The series of source/drain regions 30 is formed employing a two step ion implantation method, employing separate ion implantation steps before and after formation of the spacers. Corresponding series of source/drain regions, gate and capacitor dielectric layers 24 and gate electrodes 26 provide a series of field effect transistor devices within both the logic region RL and memory region RM of the semiconductor substrate.

FIG. 7 shows a schematic cross-sectional diagram of a semiconductor product in accord with a preferred embodiment of the invention. The semiconductor product is an embedded memory and logic semiconductor product. The embedded memory and logic semiconductor product allows for enhanced storage cell capacitance by forming an isolation trench and an isolation region deeper within a memory region than a logic region. The deeper isolation trench and isolation region allow for forming a deeper capacitor node region within a semiconductor substrate and a larger capacitor plate layer mirroring the capacitor node.

The preferred embodiment of the invention is illustrative of the invention rather than limiting of the invention. Revisions and modifications may be made to methods, materials, structures and dimensions employed for fabricating a semiconductor product in accord with a preferred embodiment of the invention while still fabricating a semiconductor product in accord with the invention, further in accord with the accompanying claims.

What is claimed is:

1. An embedded semiconductor product comprising:
a semiconductor substrate;
a first isolation trench adjoining a logic cell active region of the semiconductor substrate; and
a second isolation trench adjoining a memory cell active region of the semiconductor substrate, wherein the second isolation trench is deeper than the first isolation trench;
a first isolation region disposed within the first isolation trench and a second isolation region disposed within the second isolation trench;
wherein a storage capacitor comprising a storage capacitor plate layer at least in part penetrates into the second isolation region.

2. The product of claim 1 wherein the first isolation trench is formed to a depth of from about 2500 to about 5000 angstroms.

3. The product of claim 1 wherein the second isolation trench is formed to a depth of from about 4000 to about 9000 angstroms.

4. A method for fabricating an embedded semiconductor product comprising:
providing a semiconductor substrate;
forming a first isolation trench adjoining a logic cell active region of the semiconductor substrate;
forming a second isolation trench adjoining a memory cell active region of the semiconductor substrate, wherein the second isolation trench is deeper than the first isolation trench;
forming a first isolation region formed within the first isolation trench and a second isolation region formed within the second isolation trench; and,
forming a storage capacitor comprising a storage capacitor plate layer, said storage capacitor plate layer formed at least in part penetration into the second isolation region.

5. The method of claim 4 wherein the semiconductor substrate is a silicon semiconductor substrate.

6. The method of claim 4 wherein the first isolation trench is formed to a depth of from about 2500 to about 5000 angstroms.

7. The method of claim 4 wherein the second isolation trench is formed to a depth of from about 5000 to about 6000 angstroms.

8. The method of claim 4 wherein the storage capacitor comprises a sidewall of the second trench, a capacitor dielectric layer formed thereupon and the storage capacitor plate layer formed on the capacitor dielectric layer.

9. A method for fabricating an embedded semiconductor product comprising:
providing a semiconductor substrate;
forming simultaneously a first isolation trench adjoining a logic cell active region of the semiconductor substrate and a second isolation trench adjoining a memory cell active region of the semiconductor substrate;
further etching the second isolation trench but not the first isolation trench such that the second isolation trench is deeper than the first isolation trench;
forming a first isolation region formed within the first isolation trench and a second isolation region formed within the second isolation trench; and,
forming a storage capacitor comprising a storage capacitor plate layer, said storage capacitor plate layer formed at least in part penetrating into the second isolation region.

10. The method of claim 9 wherein the semiconductor substrate is a silicon semiconductor substrate.

11. The method of claim 9 wherein the first isolation trench is formed to a depth of from about 2500 to about 5000 angstroms.

12. The method of claim 9 wherein the second isolation trench is formed to a depth of from about 4000 to about 9000 angstroms.

13. The method of claim 9 wherein the storage capacitor comprises a sidewall of the second isolation trench, a capacitor dielectric layer formed thereupon and the storage capacitor plate layer formed on the capacitor dielectric layer.

14. The method of claim 13, wherein the capacitor dielectric layer is formed on the logic cell active region to comprise a gate dielectric layer.

15. The method of claim 8, wherein the capacitor dielectric layer is formed on the logic cell active region to comprise a gate dielectric layer.

16. The product of claim 1, wherein the storage capacitor comprises a sidewall of the second isolation trench, a capacitor dielectric layer disposed thereupon and the storage capacitor plate layer disposed on the capacitor dielectric layer.

17. The product of claim 16, wherein the capacitor dielectric layer is disposed on the logic cell active region to comprise a gate dielectric layer.

* * * * *